United States Patent [19]

Barajas

[11] Patent Number: 4,509,994

[45] Date of Patent: Apr. 9, 1985

[54] SOLDER COMPOSITION FOR HIGH-DENSITY CIRCUITS

[75] Inventor: Felix Barajas, Huntington Beach, Calif.

[73] Assignee: McDonnell Douglas Corporation, Long Beach, Calif.

[21] Appl. No.: 646,759

[22] Filed: Sep. 4, 1984

[51] Int. Cl.³ .............................................. B23K 35/34
[52] U.S. Cl. ...................................................... 148/24
[58] Field of Search ..................................... 148/24–26

[56] References Cited

U.S. PATENT DOCUMENTS 3,684,533  8/1972  Conwicke ............................. 148/24

*Primary Examiner*—Peter D. Rosenberg
*Attorney, Agent, or Firm*—Max Geldin

[57] ABSTRACT

Novel solder composition or solder cream, particularly adapted for soldering components in high-density electronic circuits, e.g., fusing electrical components to small pads of the order of 10 mils square or smaller, comprising a narrow range of between 10 and 14% flux-containing vehicle and between 86 and 90% of solder metal, and employing solder metal of particle size ranging from about 0.2 to about 35 microns.

24 Claims, 4 Drawing Figures

SOLDER COMPOSITION FOR HIGH-DENSITY CIRCUITS

BACKGROUND OF THE INVENTION

This invention relates to novel solder compositions or solder creams, and is particularly concerned with the provision of solder compositions especially adapted for soldering components in high-density electronic circuitry.

A solder cream is a material that is capable of being applied to a substrate or surface in a specific pattern using screening or analogous methods which can subsequently undergo fusing to provide an electrical joint or interface commonly described as a solder joint. The solder cream generally consists of metallic balls of various alloys such as tin-lead, tin-lead-silver, tin-lead-gold, etc., contained in a vehicle including a flux such as wood rosin, or derivatives thereof. In addition, a suspension medium is present in the vehicle and is combined with the flux to provide a paste substance of uniform texture, consistency, and improved surface wetting. In addition, an organic solvent is present in the vehicle to provide the proper consistency for the vehicle.

In electronic circuitry, solder creams or compositions are employed to secure miniature electronic components to a circuit on a substrate such as ceramic or glass, or the like. Circuits similar to those used on printed circuit boards are produced on the substrates. In certain instances, the circuit is located on one side of the substrate, with pads being provided in certain areas, other parts of the circuit being covered with an insulating material.

The solder cream having a paste-like consistency is applied, for example, by means of a silk screen, to the pads on the circuit board. Thereafter, the electronic components are carefully positioned with their peripheral contacts on the solder cream-coated pads. When all of the components are thus in place, the board, with such components temporarily positioned and retained thereon by the solder cream, can be placed in a vapor reflow system and subjected to a sufficiently high temperature to cause the metal content of the solder cream to liquefy and the contacts of the electronic components to be fused and to adhere to the pads on the circuit board.

My U.S. Pat. No. 4,373,974 discloses a novel solder composition for soldering components in electronic circuitry, whereby the formation of solder balls is essentially eliminated, thus avoiding the necessity of removing such solder balls. Such composition comprises solder metals such as tin and lead, dispersed in a vehicle containing viscosity-controlling agents, organic solvents and a flux, employing a narrow range of between 13 and 14% vehicle, and between 86 and 87% of solder metal, by weight of the solder composition.

Although the composition of my above patent has proved highly satisfactory for soldering components generally in electronic circuitry, electronic circuits of increasingly higher density have been developed recently, and the higher the density of such circuits, the smaller the pad sizes become to which the electronic components are to be connected, and the smaller the electrical connections become. It has been found that in order to achieve efficient fusing of electrical components to the very small pad sizes of the order of 10 mils square or smaller, the composition of the solder formulation must be modified from that disclosed in my above patent. In the solder composition of my above patent, the particle size of the solder metal ranges from 40 to 70 microns, corresponding to a range of approximately 1.5 to about 3 mils. Therefore, the particle size of the solder metals of my above patent is too large, creating difficulties in fusing electronic components to small pads of the sizes noted above. On the other hand, as the particle size of the solder metals is reduced, the ability of the vehicle including the flux to hold the powder in suspension in the composition presents a problem.

It is accordingly an object of the present invention to provide a solder composition or solder cream which is especially adapted for soldering components in high-density electronic circuits.

Another object is the provision of a solder composition of the above type which minimizes formation of undesirable solder balls causing short circuits between electronic components.

A still further object of the invention is to provide an efficient solder composition of the type disclosed in my above patent, and which is particularly adapted for soldering electronic components to small pads in high-density electronic circuits.

SUMMARY OF THE INVENTION

It has now been found that the above objects and advantages can be achieved according to the invention by the provision of a soldering composition of the general type disclosed in my above patent, but employing solder metals of particle size ranging from about 0.2 to about 35 microns.

Thus, the solder composition of the invention comprises by weight (a) 10–14% of a liquid vehicle containing a viscosity-controlling agent and a flux and (b) 86 to 90% of a solder metal dispersed in said vehicle, the particle size of the solder metal or metals ranging from about 0.2 to about 35 microns.

The above-noted size range of the particles of solder metal in the solder composition having the above-noted range of proportions of solder metal, results in a uniform suspension of the solder metals in the vehicle and a composition which permits efficient soldering of electronic components in high-density electronic circuits, and particularly for fusing electronic component to small area pads in such circuits. At the same time, the solder composition retains its important characteristic of enabling such soldering to take place essentially in the absence of solder ball formation.

Briefly, the invention accordingly provides a solder composition especially adapted for soldering components in high-density electronic circuitry, and whereby following soldering essentially no solder balls are formed, comprising finely-divided solder metal dispersed in a liquid vehicle containing (a) a thixotropic agent, (b) an organic solvent and (c) a flux, said liquid vehicle being present in an amount of 10 to 14%, and said solder metal being present in an amount of 86 to 90%, by weight of said composition, the particle size of said metal ranging from about 0.2 to about 35 microns, and preferably from about 0.5 to about 10 microns.

These and other objects and features of the invention will become apparent from the following detailed description thereof.

DETAILED DESCRIPTION OF THE INVENTION COMPOSITION AND PREFERRED EMBODIMENTS

The invention will be more clearly understood by reference to the description below, taken in connection with the accompanying drawings wherein.

Figure 1:
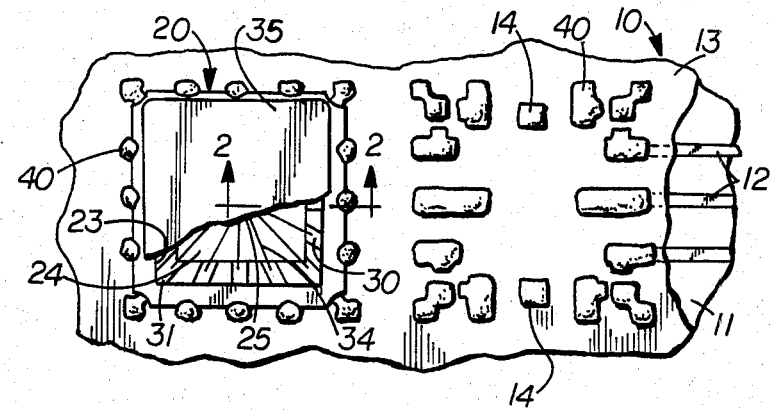
FIG. 1 is an enlarged, fragmentary plan view of a portion of a circuit board of a high-density circuit, with a component mounted thereon and connected to a pad of small area size by means of the solder cream of the present invention.
Figure 2:
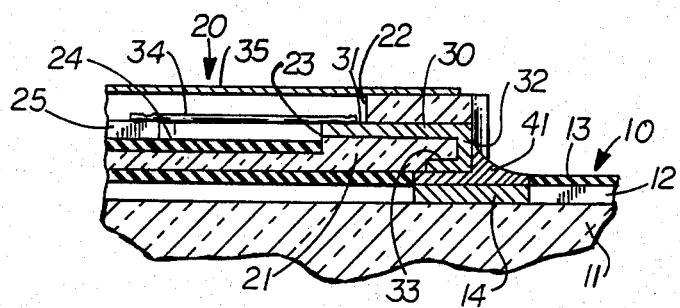
FIG. 2 is a further enlarged, fragmentary, sectional view through the component and the circuit board, and taken substantially along the line 2—2 of FIG. 1.

With reference to the drawings, and with reference primarily to FIGS. 1 and 2, there is illustrated a circuit board 10 which comprises a substrate 11 which may be of any nonelectrically conductive material such as ceramic, plastic or the like. In the manner familiar to this art, a circuit 12 is printed or otherwise deposited upon the substrate 11. Thereafter, a coating 13, which may be lacquer or the like, is deposited on the major portion of the circuit 12, leaving exposed areas or pads 14. The circuit 12 may be formed from any suitable metallic material such as gold, platinum, copper, or the like, which has an affinity for solder.

Chip carriers, indicated generally at 20, (or other electrical components) are intended for electrical attachment to the exposed pads 14 on the circuit board through use of the solder cream of this invention. The pads 14 are of square configuration and generally of small size of 10 mils square or smaller. The chip carriers 20 are generally made from a nonconducting material, such as ceramic, and, in the present instance, are illustrated as being generally square. Each chip carrier includes a body 21 which has stepped openings 22 and 23 therein. An insulating material 24 is deposited within the opening 23 and retained therein by any suitable cement.

The chip carriers are also provided with contacts 30 of a conducting material such as gold or the like. The contacts 30 are embedded in the carrier body 21 and have portions extending into the recess 22 as at 31. The contacts 30 extend to the outer edge of the body 21, over that edge as at 32, and inwardly as at 33 to expose contact portions that are configured generally to correspond with the pattern of the pads 14 on the circuit board 10. The inner ends 31 of the contacts 30 are connected to the chip 25 by means of small wires 34. Each of the ends of the wires 34 have their connections secured as by welding. The wires 34 must be secured utilizing special welding machinery under microscopic viewing. A cover 35 is generally secured to the body 21 to protect the wires 34 and the chip 25.

The solder cream of the present invention is used by first applying it to each of the pads 14. This may be accomplished by means of a syringe-type dispenser or preferably by screening the solder cream onto the pads 14.

Following application of the solder cream to the pads 14, the chip carriers 20 are carefully positioned whereby the portions 33 of the contacts 30 are immersed in the solder cream shown at 40 in FIG. 1. The chip carriers are thus temporarily retained in position by means of the solder cream, its viscosity being such as to form a soft attachment.

Figure 4:
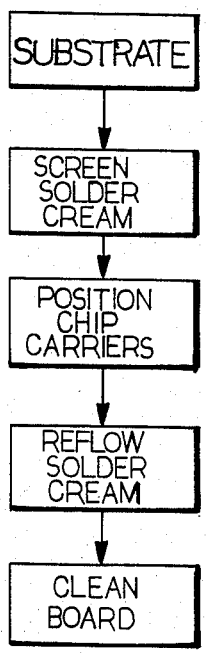
FIG. 4 is a diagrammatic view illustrating major steps in one process for using the solder cream of this invention.

Thereafter, the circuit board containing the temporarily positioned chip carriers is placed in a vapor reflow system and heated by means of the vapor therein, to a temperature sufficient to flow the metal component of the solder cream. Upon removal of the board from the vapor reflow system, the board is subjected to a vapor bath of a suitable solvent which cleans the board and removes residual flux and its vehicle therefrom. These steps in the process are illustrated in FIG. 4 and the final solder connection is as illustrated at 41 in FIG. 2 which, through the wires 34 and contacts 30, electrically connect selected areas of the chip 25 to each individual pad 14.

The solder composition or solder cream of the invention permits the formation of strong efficient solder connections as at 41 between the small square pad 14 and the electrical contacts 30 to the chip 25. Further, through use of the solder cream of this invention, virtually no solder balls are created between, around or beneath electronic components such as between or beneath the pads 14, thus avoiding production of electrical shorts between the pads.

The vehicle for the solder metals of the solder composition of the invention is a liquid composition having desirable viscosity characteristics and which maintains the solder metals in suspension without settling of the fine solder metal particles. Such vehicle can include viscosity controlling agents, organic solvents, rosin, or derivatives thereof, as flux, and other components such as organic amines.

Thus, one component of the vehicle is a compound which increases the viscosity of the vehicle to the desired consistency, such as a thixotropic agent, and which can also function as a suspension medium to prevent settling of the solder particles. The amount of thixotropic agent is within the range 0.5–10%. Any thixotropic agent can be used, provided that it does not leave a residue insoluble in organic solvents (e.g., trichloroethylene) on the solder metal, after the firing operation. Common thixotropic agents are disclosed by Eirich, "Rheology," Academic Press, New York, 1967, Vol. 4, page 457. A preferred thixotropic agent is hydrogenated castor oil (Baker Castor Oil Co. "Thixatrol"). Carboxy Methyl cellulose also can be used.

The second component of the vehicle is an organic solvent which provides the proper consistency for the vehicle. Such organic solvent is present in the range of 30 to 60%, by weight of the vehicle. Any of the common organic solvents, preferably non-chlorinated, may be used for this purpose, such as ketones, e.g., acetone, methyl ethyl ketone, methyl isobutyl ketone, and the like, esters such as alkyl acetates, mineral spirits, the terpenes (e.g. betaterpineol), ethylene glycol, glycerol, aromatic hydrocarbons such as benzene, toluene, xylene, and phenol, and mixtures thereof. Preferably a solvent such as 2-butoxy (ethyl) ethyl acetate, 2-butoxy ethyl acetate, ethylene glycol or beta-terpineol, is used, The third component of the vehicle is a flux. Various types of fluxes can be employed. Thus, one suitable flux is a rosin type flux, that is, rosin or derivatives thereof. Rosin, the non-steam volatile fraction of pine oleo-resin, is a mixture of five isomeric diterpene acids, the most abundant component being abietic acid. The terminology "rosin and derivatives thereof" includes rosin derived from gum, wood or tall oil, the acids in rosin such as abietic acid, and any of their derivatives, such as "Staybelite," "Poly-Pale," "Dimerex," "Vinsol," etc. The amount of flux present in the vehicle can range from 2–65%, preferably 30–60%, by weight of the vehicle.

Other organic materials can be employed as flux, such as petrolatum, rosin mixed with waxy or fatty material, paraffin waxes and long chain organic acids such as adipic acid, and tars.

Also, the flux can be a water-soluble material such as an aqueous solution of sorbitol.

The flux also can comprise inorganic materials such as, for example, borax, alkali metal fluoborates, and the like.

Other components such as amine hydrochlorides, e.g., propylamine hydrochloride, hydroxyl substituted aliphatic amines, and aliphatic amines such as isopropyl amine, can be present, e.g., to remove surface oxides of the solder metals. These materials can be present in amounts ranging from 0.01 to 10% by weight of the vehicle.

The solder compositions of the invention contain finely divided solder metals, in the form of metallic balls or particles, dispersed in the vehicle. The solder metals can be any of the conventional single or multiphase metals normally used for soldering, particularly tin, lead and silver, and alloys and mixtures thereof. Alloys or mixtures of tin-lead, tin-lead-silver, tin-silver and lead-silver, for example, can be employed. A preferred mixture of solder metals employed in the solder composition of the invention consists essentially of a mixture of lead, tin and silver, which can contain from 61.5 to 62.5% tin, 1.75 to 2.25% silver, and the balance lead. A particularly preferred solder metal mixture consists of 36% lead, 62% tin and 2% silver.

According to the invention, the solder metal particles should be finely divided, and should have a particle size ranging from about 0.2 to about 35 microns, preferably ranging from about 0.5 to about 10 microns in diameter. The metal particles are preferably round rather than oval or irregular, since oval or irregular particles clog the screens, whereas round particles pass freely through the screen. Thus, with round particles proper flow of the metallic particles through the screen takes place.

The solder compositions of the invention are prepared by admixing the solder metals and the vehicle including flux in certain proportions, as noted below. The use of a narrow range of 10 to 14%, and optimally 13.5%, of vehicle containing flux, and 86 to 90%, optimally 86.5% of solder metals, in the form of small particles of about 0.2 to about 35 microns size, and particularly about 0.5 to about 10 microns size, e.g. of lead, silver and tin, by weight, is effective in soldering components of high-density electronic circuits while practically entirely eliminating the presence of solder balls following soldering.

The solder compositions of the invention can be employed for soldering components such as capacitors, resistors, integrated circuits and their packages or carriers, transistors, diodes, etc., onto a circuit, particularly a high-density circuit, carried on a substrate.

The solder composition of the invention can be applied to any suitable substrate such as the above-noted small metal pads on a circuit board to which contacts of electronic components are to be soldered. Such application of the solder composition or solder cream can be made by use of metal screening to apply the solder cream to the pads. However, other modes of applying the solder cream in addition to screen printing, can be employed, including, for example, dipping the objects to be soldered into the solder composition, or employing syringe techniques.

Thereafter, the solder is heated to a temperature at which the solder becomes molten and a highly adherent fused solder bond is formed. For this purpose, vapor phase soldering is a preferred method, although other methods of heating the solder such as the use of belt furnaces, and infra-red heating can be employed. Any atmosphere for heating can be used, e.g., air, or an inert atmosphere employing an inert gas such as nitrogen.

The following table shows examples of soldering compositions according to the invention, the amounts noted being in terms of weight percent:

TABLE

| COMPOSITIONS | A | B | C | D | E | F | G |
|---|---|---|---|---|---|---|---|
| Vehicle (weight percent) | 13.5 | 13.0 | 14.0 | 13.2 | 12 | 11 | 11.5 |
| Abietic acid | 59 | 59 | 59 | 50 | 50 | — | 35 |
| 2-Butoxy (ethyl) ethyl acetate | 31 | 31 | 31 | 40 | — | 50 | 55 |
| Hydrogenated caster oil | 8 | 8 | 8 | 7 | 7 | 6 | 7 |
| Isopropyl amine | 2 | 2 | 2 | 3 | 3 | 4 | 3 |
| Ethylene glycol | — | — | — | — | 40 | 40 | — |
| Metal (weight percent) | 86.5 | 87 | 86 | 86.8 | 88 | 89 | 88.5 |
| Lead | 36 | 36 | 36 | 40 | 37 | 4 | 36 |
| Tin | 62 | 62 | 62 | 60 | 63 | 96 | 62 |
| Silver | 2 | 2 | 2 | — | — | — | 2 |
| Metal particle size (av.) (microns) | 0.5 | 2 | 5 | 10 | 20 | 25 | 30 |

Figure 3:
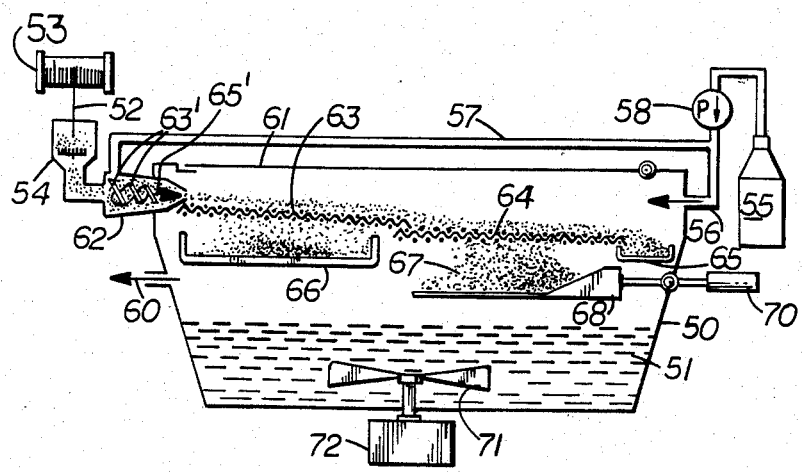
FIG. 3 is a schematic and diagrammatic view illustrating one method of manufacture of the solder cream of the present invention.

FIG. 3 illustrates one means for making the solder cream of the invention. With reference to FIG. 3 the present solder cream may be manufactured using an apparatus similar to that illustrated therein. A so-called dry box 50 may be employed in which is deposited a quantity of the vehicle and flux 51. The metallic component of the solder cream may be in the form of a wire 52 dispensed from a supply 53 into a cutter, shaver or grinder, illustrated at 54, to reduce the metal to small particles of between 0.2 and 35 micron size. The box 50 is maintained with an inert atmosphere of nitrogen or the like, supplied from a source 55 through conduits 56 and 57 and a pump 58. The conduit 56 communicates with the interior of the box 50, there being a small bleed orifice 60 in order to maintain the atmosphere. The box may also be provided with a cover 61 for access thereto.

The conduit 57 extends to a nozzle 62 which receives the small metallic particles from the cutter 54. These particles travel through the interior of the nozzle 62 and, by contact therewith, are reduced to substantially round, minute particles. As noted in FIG. 3 of the drawings, nozzle 62 has internal ribs 63' which cause the particles to spiral therein in an ever-reducing spiral path, as illustrated by the arrow 65', thus creating the round nature of the particles. The metal particles, being round, can be used more efficiently in the silk screening operation, when applying the solder cream to a substrate, since particles of any other shape tend to clog the silk screen and produce an uneven distribution of the solder cream on the substrate. The metallic particles leave the nozzle 62 and are blown onto a suitable fine-mesh screen 63 of a size smaller than the size of the desired particles. Thereafter the metallic particles travel onto a screen 64, having a mesh to permit travel therethrough of the metallic particles of the desired size. Particles larger than the desired size may be collected by a tray 65 with the fine particles being collected by a tray 66. The desired size particles as at 67, are dispensed from the screen 64 onto a tray 68, the weight thereof, as determined by a counterbalance 70, serving to deliver the particles into the vehicle or flux 51. Thereafter, the particles 67 are mixed with the vehicle 51 by means of a mixer 71 driven by a suitable power source 72.

While FIG. 3 illustrates one method of combining the desired size metallic particles with the vehicle to produce the solder cream, in practice, other similar methods may be used and several additional screening steps may be employed to insure the desired size of the metallic material. This operation is carried out within an inert atmosphere, e.g., nitrogen, or the like, substantially to eliminate oxidation of the metallic particles and to produce a solder cream substantially free of oxides which tend to inhibit attachment to the contacts of the chip carriers and the pads on the circuit boards, and to eliminate contaminated solder joints.

The following are some specific examples of further practice of the invention:

EXAMPLE I

In producing solder composition or solder cream A of the above Table, a lead-tin-silver metallic mixture in the proportions of 36% lead, 62% tin and 2% silver, is formed into a very finely divided powder which is substantially free of oxides.

The metallic powder is blown into a chamber, the metal balls are screened so that the average particle size thereof is about 0.5 microns, and the particles are then mixed with the vehicle, such operations being carried out in an inert atmosphere, e.g., of nitrogen, to eliminate oxidation of the metals, as described in detail above and illustrated in FIG. 3. In this example, the flux-containing vehicle and metal mixture were combined in a percentage of 13.5% of the flux-containing vehicle and 86.5% of the metallic mixture, by weight. The viscosity of the resulting flux composition or cream was 500,000±10% centipoises at 20° C.

The solder cream was used to secure miniature electronic components in a high density circuit to a ceramic substrate. A printed circuit was produced on the substrate. The circuit was on one side of the substrate, with approximately 10 mil square pads composed of platinum and gold being provided in certain areas, other parts of the circuit being covered with an insulating material.

A screen was placed over the circuit and the pads, and the above solder cream was screened onto the pads on the circuit board. Thereafter, electronic components including capacitors and resistors were carefully positioned with their peripheral contacts on the solder cream-coated pads.

When all of the components were thus in place, the board, with such components temporarily positioned and retained thereon by the solder cream, was placed in a vapor phase system and subjected to a temperature of 215° C. Since the metal mixture or alloy employed has a melting range between 177° C. and about 189° C., the system temperature melted the metallic particles in the solder cream and fused or adhered the contacts of the components, to the pads on the circuit board, leaving the components securely positioned in place and soldered to the pads on the board.

Following the soldering operation, it was observed that the contacts such as contact portions 33 in FIG. 2, were securely soldered as at solder connections 41 to the small pads 14, and that there were no solder balls formed on the substrate either between or about the contacts of the electronic components or beneath the components.

EXAMPLE II

The procedure of Example I was followed employing respectively, solder compositions B through G of the above Table.

Substantially the same results were obtained, namely, effective soldering of the electronic components to the small pads 14, with no formation of solder balls on the substrate either between the contacts of the electronic components or beneath the components.

From the foregoing, it is seen that the invention provides a novel solder composition comprised of essentially conventional components including vehicle containing flux and solder metals. However, by the employment of solder metals of a certain fine particle size in conjunction with a narrow range of proportions of vehicle and solder metal in the solder composition, it has been found that when such solder composition is employed particularly for soldering electronic components in a high-density electronic circuit, such as for connection of electrical contacts to pads of very small size positioned on a substrate, efficient solder connections between such components can be achieved, with practically complete elimination of solder balls causing shorts, between, around and beneath the electronic components, thus providing acceptable electronic circuits.

While particular embodiments of the invention have been described for purposes of illustration, it will be understood that various changes and modifications within the spirit of the invention can be made, and the invention is not to be taken as limited except by the scope of the appended claims.

What is claimed is:

1. A solder composition especially adapted for soldering components in high-density electronic circuitry, whereby following soldering essentially no solder balls are formed, said solder composition comprising finely divided solder metal dispersed in a liquid vehicle containing (a) a thixotropic agent, (b) an organic solvent and (c) a flux, the particle size of said metal ranging from about 0.2 to about 35 microns, said liquid vehicle being present in an amount of 10 to 14%, and said solder metal being present in an amount of 86 to 90%, by weight of said composition.

2. The composition of claim 1, the particle size of said metal ranging from about 0.5 to about 10 microns.

3. The composition of claim 1, the metal particles of said solder metal being round.

4. The composition of claim 1, said flux being a rosin type flux or a paraffin wax.

5. The composition of claim 1, employing 13.5% of said liquid vehicle and 86.5% of said solder metal by weight.

6. The composition of claim 1, said solder metal being selected from the group consisting of tin, lead and silver, and alloys and mixtures thereof.

7. The composition of claim 1, said metal being alloys or mixtures of tin, lead and silver; tin and lead: tin and silver; and lead and silver.

8. The composition of claim 1, said thixotropic agent being hydrogenated caster oil or carboxy methyl cellulose.

9. The composition of claim 1, said organic solvent being 2-butoxy (ethyl) ethyl acetate, 2-butoxy ethyl acetate, ethylene glycol or beta-terpineol.

10. The composition of claim 1, said flux comprising abietic acid.

11. The composition of claim 1, wherein said vehicle consists of 0.5-10% of (a), 30-60% (b) and 20-65% of (c), by weight.

12. The composition of claim 1, said thixotropic agent (a) being hydrogenated castor oil, said organic solvent (b) being 2-butoxy (ethyl) ethyl acetate, and said flux (c) comprising abietic acid.

13. A solder composition especially adapted for soldering components in high-density electronic circuitry, whereby efficient electrical connections can be made between small components and following soldering essentially no solder balls are formed, said solder composition comprising finely divided solder metal dispersed in a liquid vehicle containing (a) 0.5-10% hydrogenated castor oil, (b) 30-60% 2-butoxy (ethyl) ethyl acetate and (c) 20-65% of a rosin type flux comprising abietic acid, the particle size of said metal ranging from about 0.2 to about 35 microns, said liquid vehicle being present in an amount of 10 to 14%, and said solder metal being present in an amount of 86 to 90%, by weight of said composition.

14. The composition of claim 13, said vehicle including 0.01-10% isopropyl amine.

15. The composition of claim 14, said vehicle consisting of 59% abietic acid, 31% 2-butoxy (ethyl) ethyl acetate, 8% hydrogenated castor oil and 2% isopropyl amine, by weight.

16. The composition of claim 15, said liquid vehicle being present in an amount of 13.5% and said solder metal being present in an amount of 86.5%, by weight of said composition.

17. The composition of claim 16, the particle size of said metal ranging from about 0.5 to about 10 microns.

18. The composition of claim 13, said metal being alloys or mixtures of tin, lead and silver; tin and lead; tin and silver; and lead and silver.

19. The composition of claim 17, said solder metal being a tin-lead-silver alloy.

20. The composition of claim 1, said solder metal being an alloy of 62% tin, 2% silver and 36% lead.

21. The composition of claim 1, said solder metal being a tin-lead alloy.

22. A solder composition especially adapted for soldering components in high-density electronic circuits, comprises by weight (a) 10-14% of a liquid vehicle containing a viscosity-controlling agent and a flux, and (b) 86 to 90% of a solder metal dispersed in said vehicle, the particle size of the solder metal ranging from about 0.2 to about 35 microns.

23. The composition of claim 22, the particle size of said metal ranging from about 0.5 to about 10 microns.

24. The composition of claim 22, said flux being a rosin type flux or a paraffin wax.

* * * * *